(12) United States Patent
An et al.

(10) Patent No.: US 12,496,626 B2
(45) Date of Patent: Dec. 16, 2025

(54) SUBSTRATE TREATING APPARATUS

(71) Applicant: SEMES CO., LTD., Chungcheongnam-do (KR)

(72) Inventors: Young Seo An, Gyeonggi-do (KR); Jae Hoon Park, Gyeonggi-do (KR); Young Ju Jo, Gyeonggi-do (KR); Kyung Jin Seo, Chungcheongnam-do (KR); Seo Jung Park, Gyeonggi-do (KR); Dae Myeong Lee, Busan (KR); Jae Hyun Lim, Chungcheongnam-do (KR); Nam Kyu Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 319 days.

(21) Appl. No.: 18/125,738

(22) Filed: Mar. 24, 2023

(65) Prior Publication Data
US 2024/0216965 A1    Jul. 4, 2024

(30) Foreign Application Priority Data
Dec. 29, 2022    (KR) .................. 10-2022-0189587

(51) Int. Cl.
| | | |
|---|---|---|
| B08B 9/093 | (2006.01) | |
| B08B 3/02 | (2006.01) | |
| G03F 7/16 | (2006.01) | |

(52) U.S. Cl.
CPC ............. *B08B 9/093* (2013.01); *B08B 3/022* (2013.01); *G03F 7/168* (2013.01); *B08B 2203/027* (2013.01); *B08B 2209/08* (2013.01)

(58) Field of Classification Search
None
See application file for complete search history.

(56) References Cited

U.S. PATENT DOCUMENTS

2022/0111422 A1*    4/2022    Ito ..................... B08B 3/022

FOREIGN PATENT DOCUMENTS

| KR | 10-1736441 | 5/2017 |
|---|---|---|
| KR | 10-2021-0113498 | 9/2021 |
| KR | 10-2022-0072016 | 6/2022 |

OTHER PUBLICATIONS

KR 101736441 B1, Apparatus For Treating Substrate And Method For Cleaning Guide Plate machine translation, Kim (Year: 2017).*
KR 20220072016 A, Apparatuse for Treating Substrate machine translation, Eum (Year: 2022).*

* cited by examiner

*Primary Examiner* — Cristi J Tate-Sims
(74) *Attorney, Agent, or Firm* — WOMBLE BOND DICKINSON (US) LLP

(57) ABSTRACT

A substrate treating apparatus includes: a spin chuck supporting a substrate; a rinse liquid supply unit supplying a rinse liquid; a first bowl including an inclined surface inclined downward in an outward direction of the spin chuck; and a guide part provided on the inclined surface of the first bowl so as to form a spiral surrounding the spin chuck and guiding a flow of the rinse liquid along the spiral.

17 Claims, 10 Drawing Sheets

[FIG. 1]
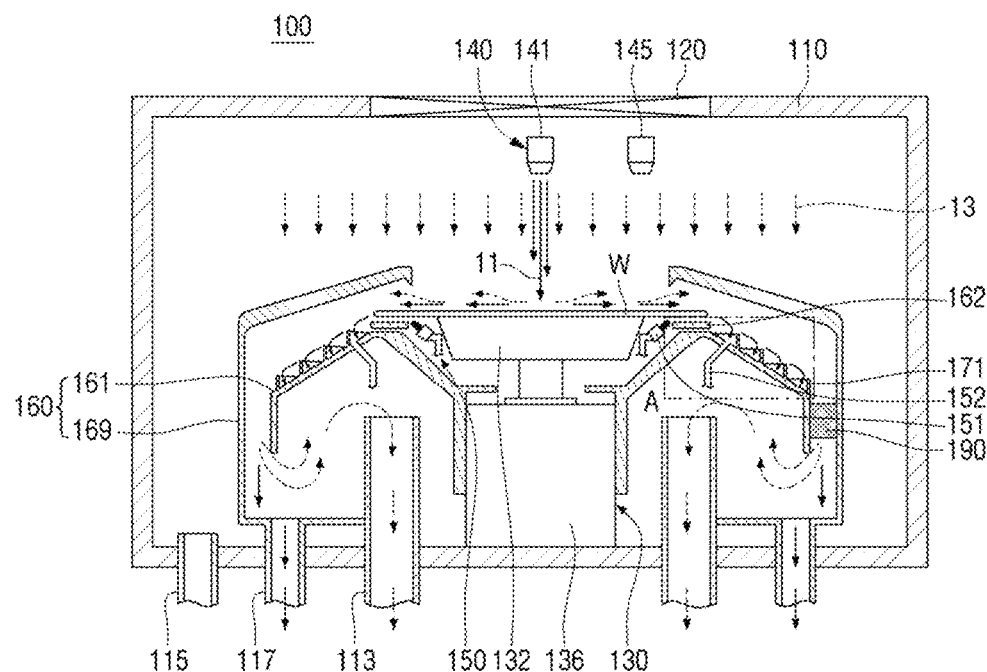
[FIG. 2]
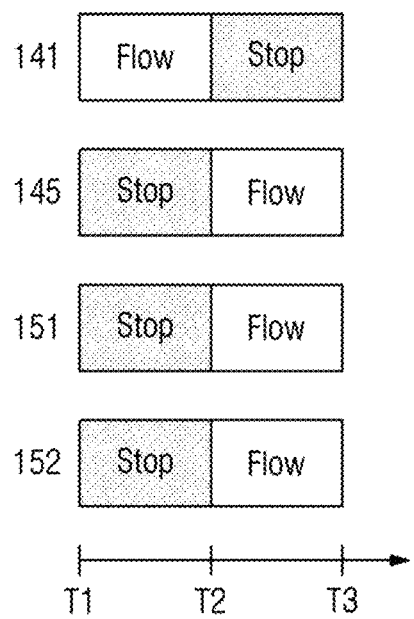

[FIG. 3]
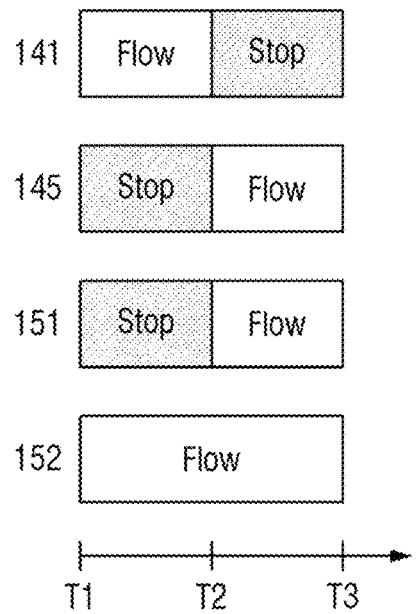
[FIG. 4]
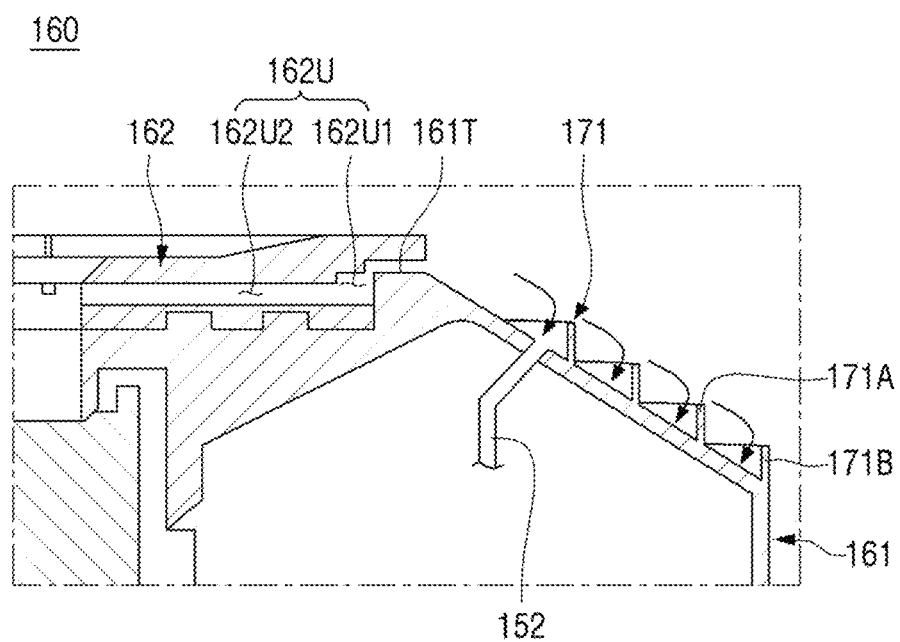

[FIG. 5]
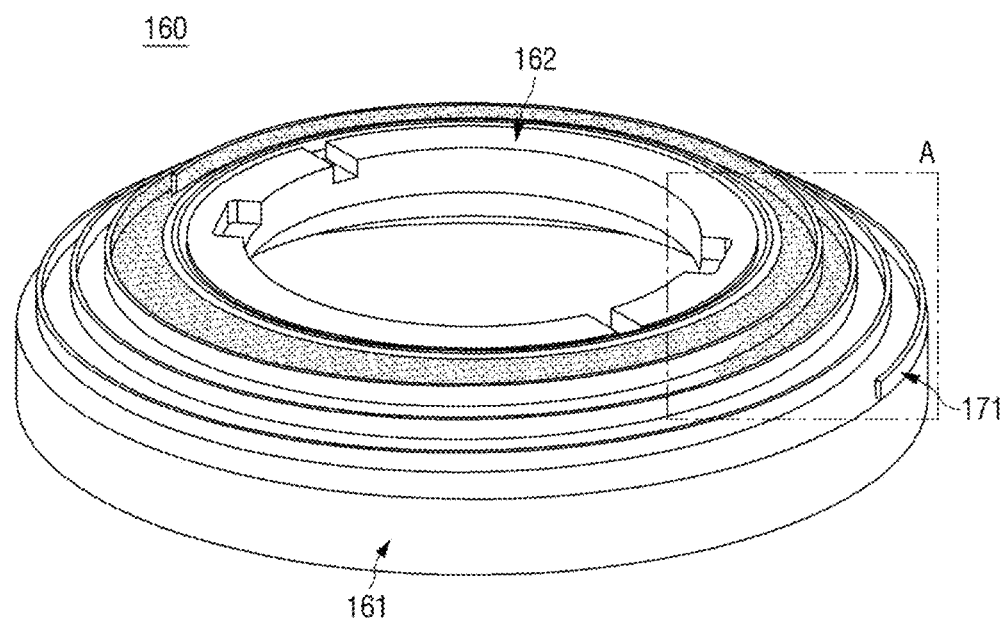

[FIG. 6]
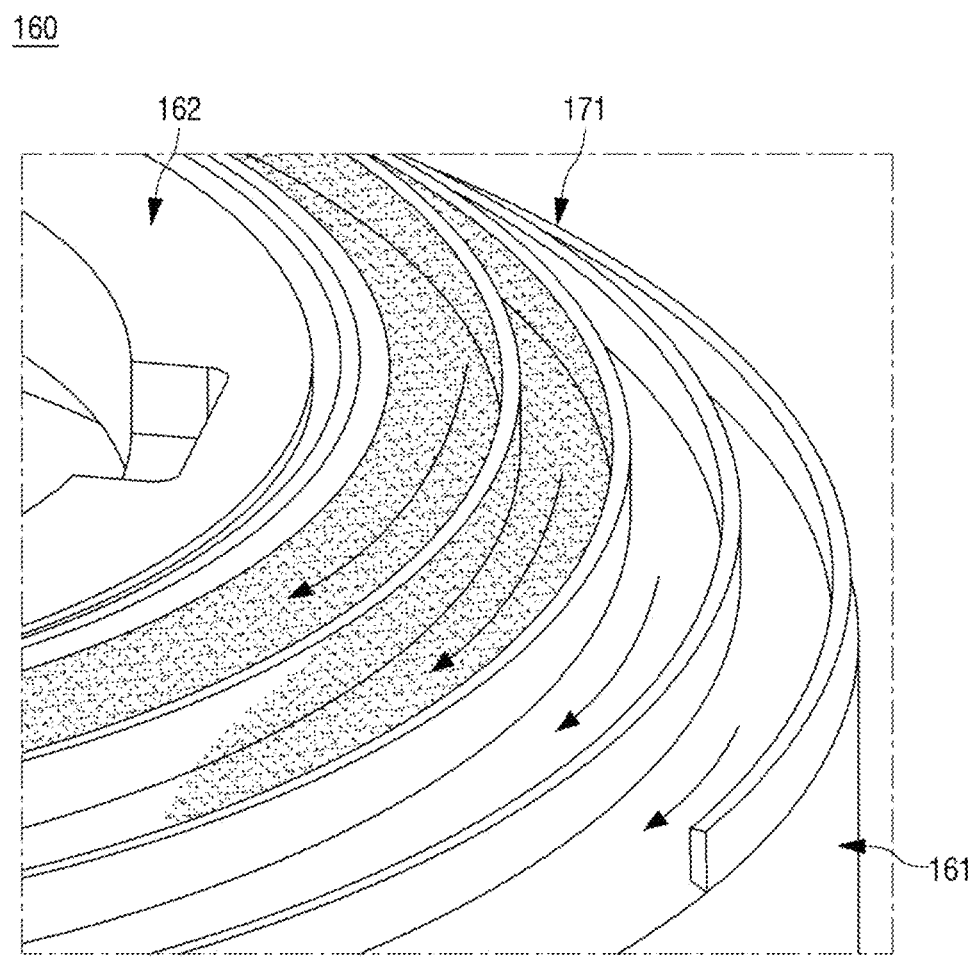

[FIG. 7]
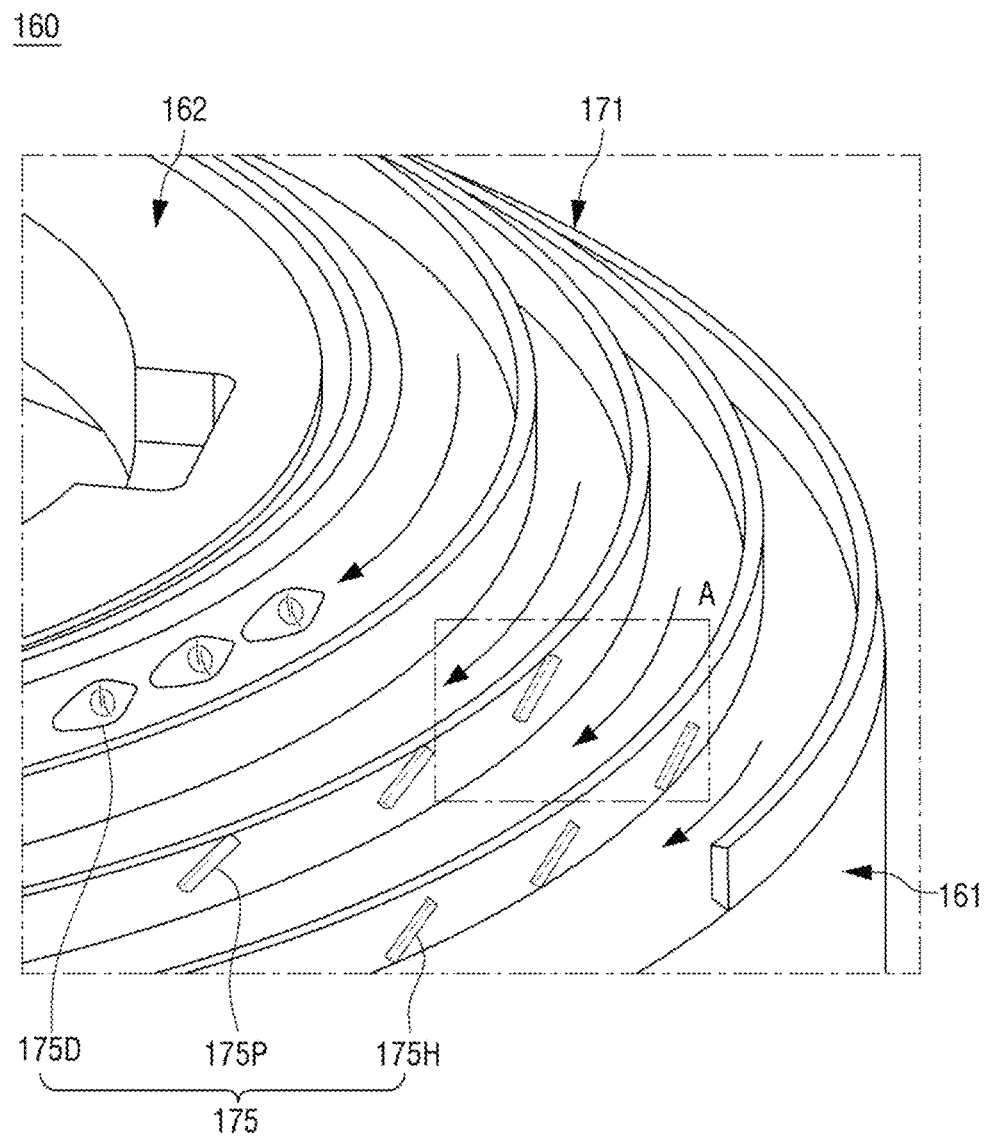

[FIG. 8]
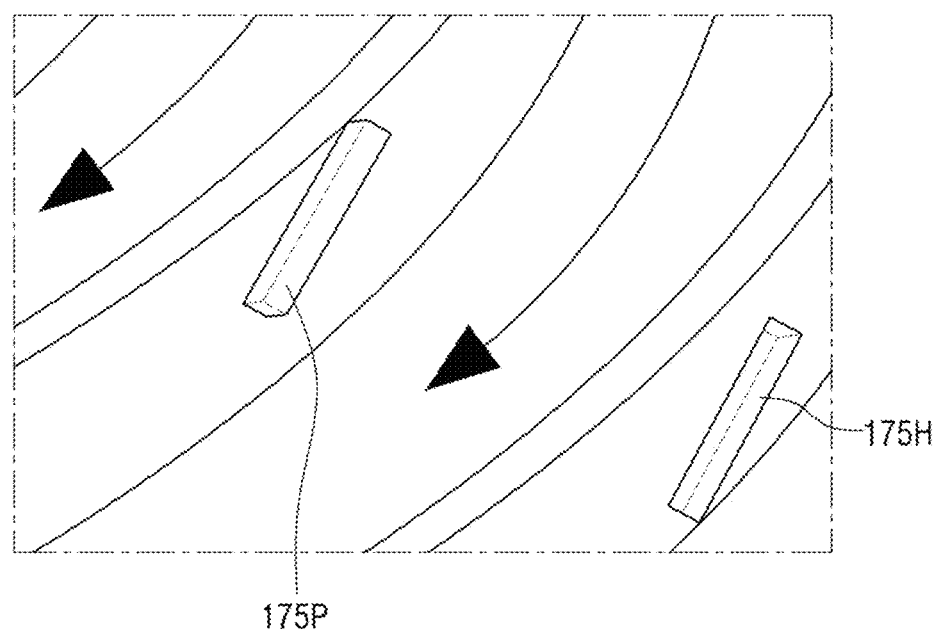

[FIG. 9]
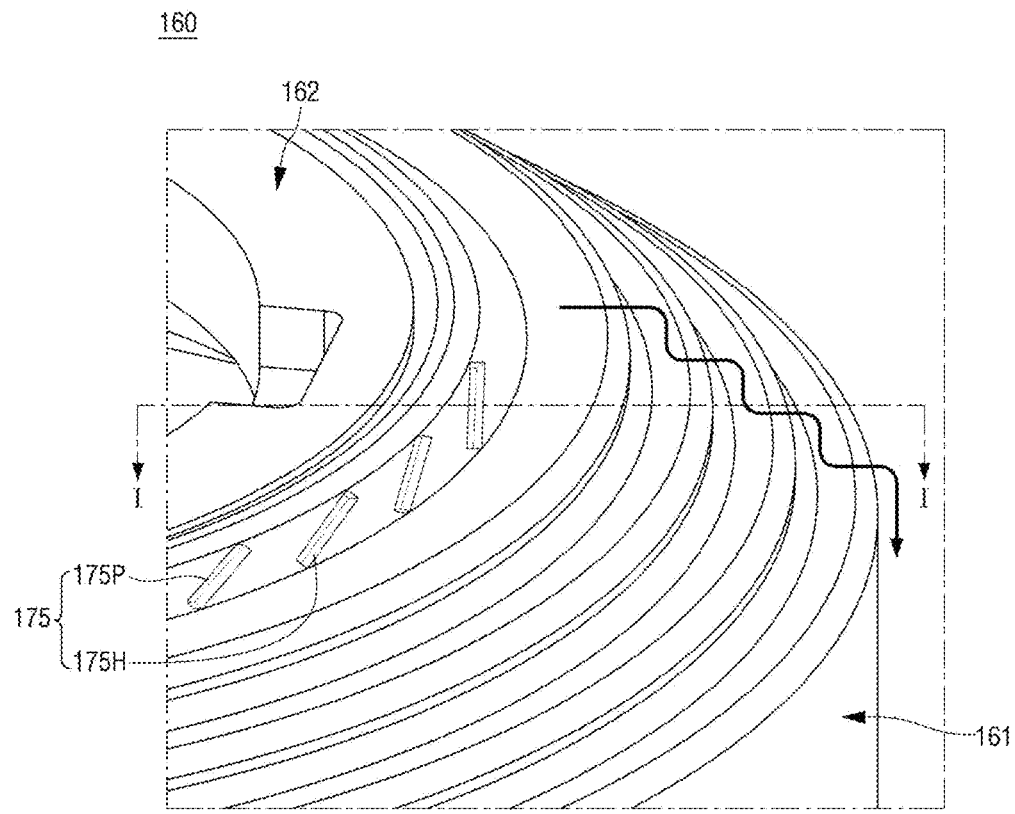
[FIG. 10]
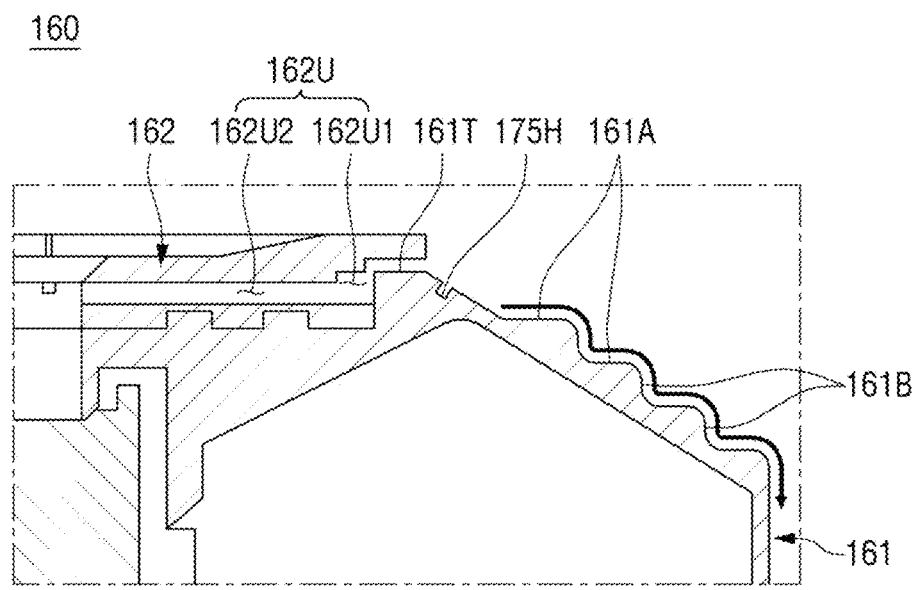

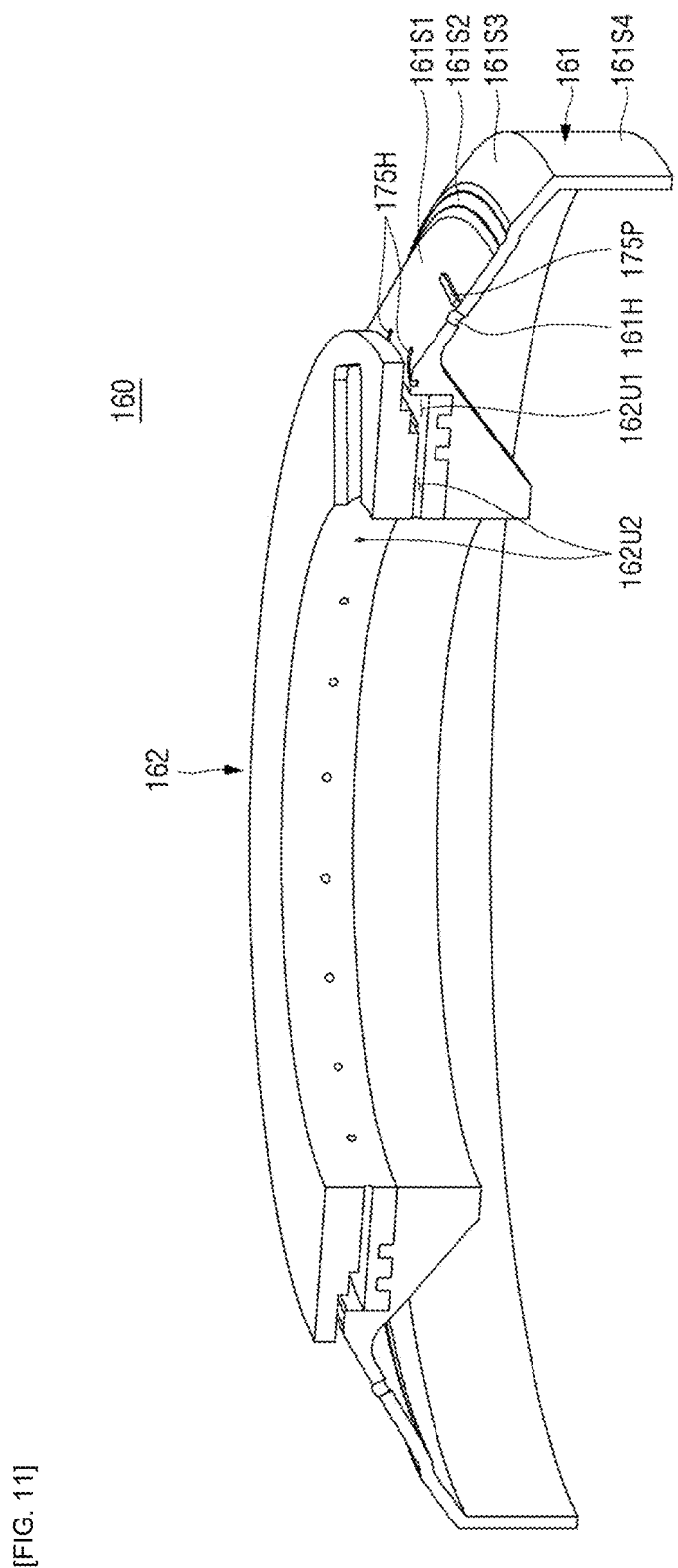
[FIG. 11]

[FIG. 12]
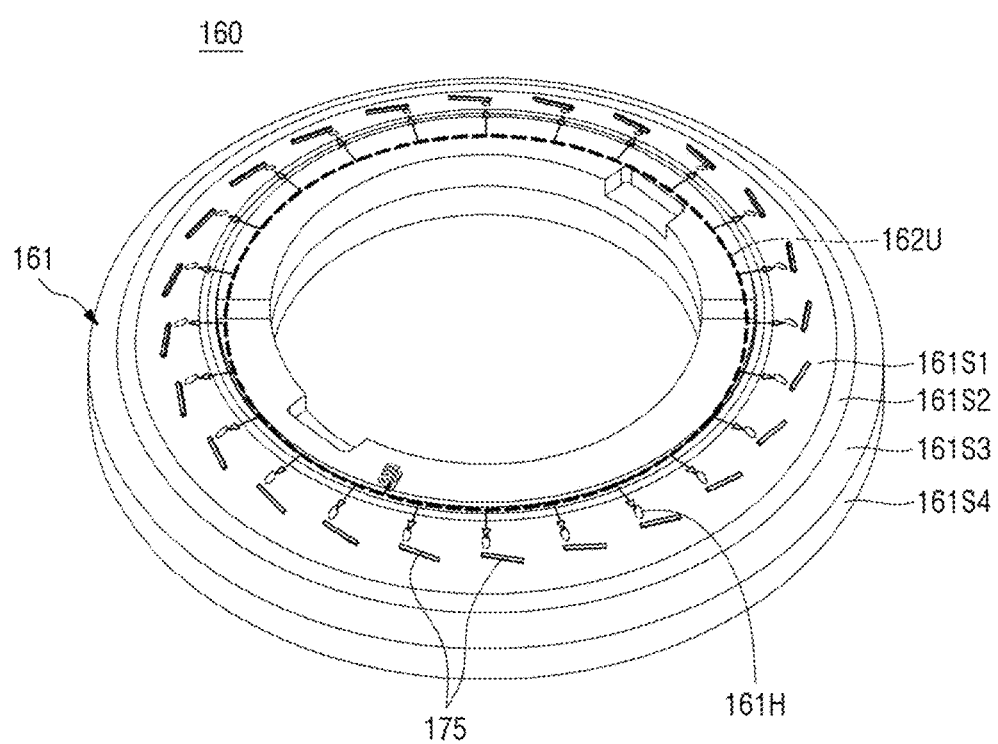

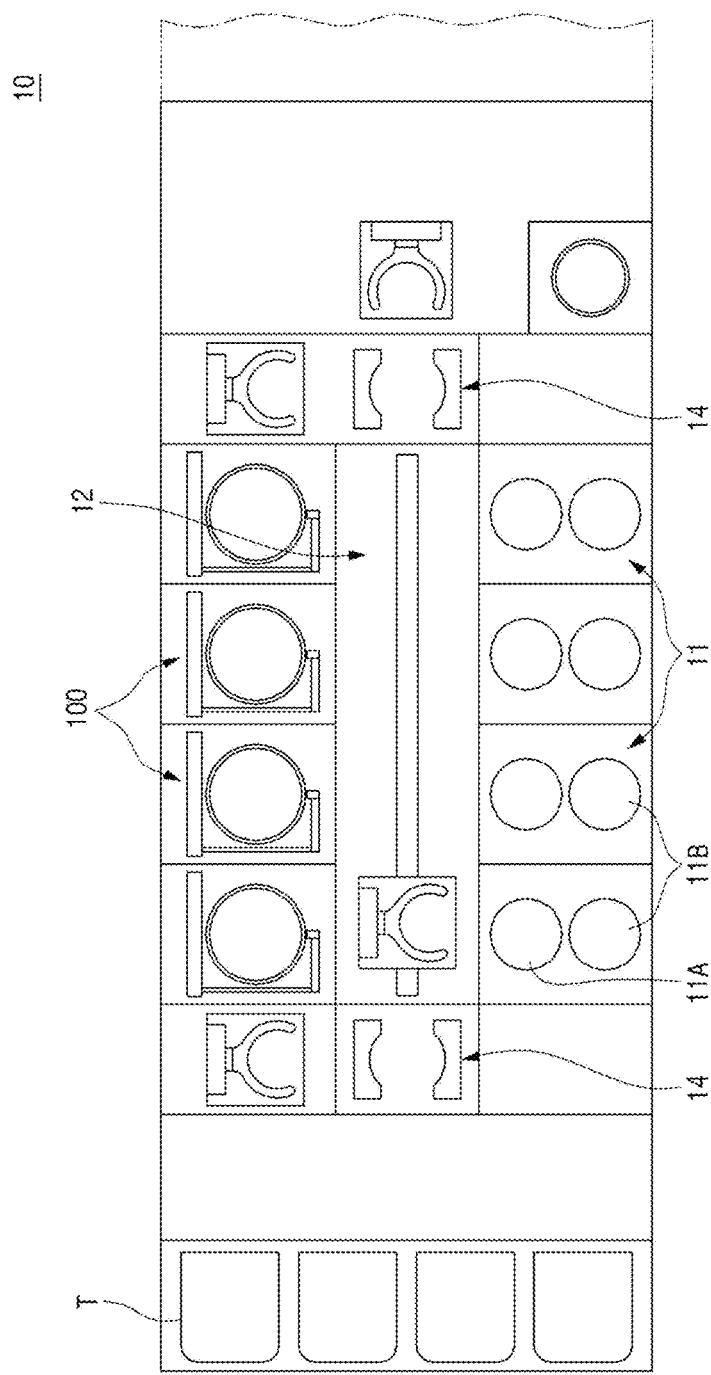
[FIG. 13]

SUBSTRATE TREATING APPARATUS

CROSS-REFERENCE TO RELATED APPLICATION

This application claims priority from Korean Patent Application No. 10-2022-0189587 filed on Dec. 29, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate treating apparatus.

2. Description of the Related Art

In processes of manufacturing semiconductor elements, a photolithography process, an etching process, an ashing process, a thin film depositing process, a cleaning process, and the like, are performed. In the photolithography process, the etching process, the ashing process, and the cleaning process among these processes, a process of treating a substrate by supplying a treatment liquid onto the substrate is performed. The photolithography process includes an applying step, an exposing step, and a developing step.

The applying step is an applying process of applying a photoresist onto the substrate, and a portion of the used photoresist is recovered through a bowl. The photoresist has viscosity and thus, may adhere to the bowl in a process in which it is recovered. For this reason, the bowl needs to be cleaned after the applying process of the substrate is performed.

SUMMARY

Meanwhile, the bowl should be separated from a substrate treating apparatus and be physically cleaned by a worker, which consumes a lot of time. That is, there is no structure in which the bowl is self-cleaned inside a liquid treating chamber where the bowl is accommodated, such that it takes time to separate the bowl in a state in which the applying process is stopped in order to clean the bowl, and accordingly, a maintenance time for the liquid treating chamber increases. In addition, when a treating vessel is contaminated by a large amount of photoresist, the bowl should be replaced. There is a need to develop a technology for decreasing the contamination of the bowl.

Aspects of the present disclosure provide a substrate treating apparatus capable of decreasing contamination of a bowl.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate treating apparatus includes: a spin chuck supporting a substrate; a rinse liquid supply unit supplying a rinse liquid; a first bowl including an inclined surface inclined downward in an outward direction of the spin chuck; and a guide part provided on the inclined surface of the first bowl so as to form a spiral surrounding the spin chuck and guiding a flow of the rinse liquid along the spiral.

According to another aspect of the present disclosure, a substrate treating apparatus includes: a liquid treating chamber forming a liquid film on a substrate; a bake chamber heating the substrate on which the liquid film has been treated in the liquid treating chamber; and a transfer chamber provided between the liquid treating chamber and the bake chamber and transferring the substrate between the liquid treating chamber and the bake chamber, wherein the liquid treating chamber includes: a spin chuck supporting the substrate; a rinse liquid supply unit supplying a rinse liquid; a first bowl including an inclined surface inclined downward in an outward direction of the spin chuck; and a guide part provided on the inclined surface of the first bowl so as to form a spiral surrounding the spin chuck and guiding a flow of the rinse liquid along the spiral.

According to still another aspect of the present disclosure, a substrate treating apparatus includes: a spin chuck supporting a substrate; a fan filter unit forming airflow in a downward direction above the spin chuck; a first bowl including an inclined surface inclined downward in an outward direction of the spin chuck and including a plurality of discharge holes formed to discharge a rinse liquid; an upper base disposed on the first bowl; a second bowl provided outside the first bowl and provided with a discharge line through which the rinse liquid is discharged; a rinse liquid supply unit supplying the rinse liquid to the substrate and the first bowl; a guide part provided on the inclined surface of the first bowl so as to form a spiral surrounding the spin chuck and guiding a flow of the rinse liquid along the spiral; a plurality of guide grooves having an engraved structure of a straight line, a curved line, or a combination thereof and extending between a pair of discharge holes neighboring to each other among the plurality of discharge holes; a plurality of projection members having an embossed structure of a straight line, a curved line, or a combination thereof on the inclined surface; and a concave groove having a concave groove structure on the inclined surface, wherein at least a portion of an upper surface of the first bowl has a curvature, a space between the upper surface of the first bowl and a lower surface of the upper base forms a first flow passage and at least a portion of the first flow passage is formed in an arc shape along the upper surface of the first bowl, the upper base includes a body and at least one second flow passage penetrating through the body and connected to the first flow passage, and the rinse liquid sequentially passes through the second flow passage and the first flow passage and is discharged to the inclined surface of the first bowl.

According to yet still another aspect of the present disclosure, a substrate treating apparatus includes: a spin chuck including a support plate supporting a substrate and having a diameter smaller than that of the substrate; a first bowl surrounding the spin chuck, including an inclined surface inclined downward in an outward direction, and including a plurality of discharge holes formed to discharge a rinse liquid; a rinse liquid supply unit connected to the discharge holes and supplying the rinse liquid to the first bowl; and a pattern member provided to neighbor to the discharge holes and concave or protruding.

Detailed contents of other exemplary embodiments are described in a detailed description and are illustrated in the drawings.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a view illustrating a substrate treating apparatus according to some exemplary embodiments of the present disclosure;

FIG. 2 is a view illustrating an example of flow states of fluids over time in the substrate treating apparatus according to some exemplary embodiments of the present disclosure;

FIG. 3 is a view illustrating another example of flow states of fluids over time in the substrate treating apparatus according to some exemplary embodiments of the present disclosure;

FIG. 4 is an enlarged view of region A of FIG. 1;

FIG. 5 is a perspective view illustrating a bowl member of a substrate treating apparatus according to a first exemplary embodiment of the present disclosure;

FIG. 6 is an enlarged view of region A of FIG. 5;

FIG. 7 is a view illustrating a portion of a bowl member of a substrate treating apparatus according to a second exemplary embodiment of the present disclosure;

FIG. 8 is an enlarged view of region A of FIG. 7;

FIG. 9 is a perspective view illustrating a portion of a bowl member of a substrate treating apparatus according to a third exemplary embodiment of the present disclosure;

FIG. 10 is a cross-sectional view taken along line I-I of FIG. 9;

FIG. 11 is a view illustrating a cut-away bowl member of a substrate treating apparatus according to a fourth exemplary embodiment of the present disclosure;

FIG. 12 is a perspective view illustrating a bowl member of the substrate treating apparatus according to a fifth exemplary embodiment of the present disclosure; and FIG. 13 is a view illustrating bake chambers and a transfer chamber together in the substrate treating apparatus according to some exemplary embodiments of the present disclosure.

DETAILED DESCRIPTION OF THE EMBODIMENTS

Hereinafter, exemplary embodiments of the present disclosure will be described in detail with reference to the accompanying drawings. Advantages and features of the present disclosure and methods for accomplishing these advantages and features will become apparent from exemplary embodiments to be described later in detail with reference to the accompanying drawings. However, the present disclosure is not limited to exemplary embodiments to be disclosed below, but may be implemented in various different forms, these exemplary embodiments will be provided only in order to make the present disclosure complete and allow one of ordinary skill in the art to which the present disclosure pertains to completely recognize the scope of the present disclosure, and the present disclosure will be defined by the scope of the claims. Throughout the specification, the same components will be denoted by the same reference numerals.

The terms as used herein are for describing exemplary embodiments rather than limiting the present disclosure. In the present specification, a singular form includes a plural form unless stated otherwise in the phrase. Components, steps, operations, and/or elements mentioned by the terms "comprise" and/or "comprising" as used herein do not exclude the existence or addition of one or more other components, steps, operations, and/or elements.

FIG. 1 is a view illustrating a substrate treating apparatus according to some exemplary embodiments of the present disclosure.

Referring to FIG. 1, a substrate treating apparatus 10 may perform a treatment liquid applying process, and may be provided with a liquid treating chamber 100. The liquid treating chamber 100 of the substrate treating apparatus 10 may include a housing 110, a fan filter unit 120, a substrate support unit 130, a liquid supply unit 140, a rinse liquid supply unit 150, a bowl member 160, a guide part 171, and a flow velocity adjusting unit 190. Here, reference numeral 11 denotes a flow of treatment liquid, and reference numeral 13 denotes airflow.

The housing 110 may be provided with a space in which the substrate support unit 130, the bowl member 160, and the like, are provided. An opening (not illustrated) may be formed on one side of the housing 110. The opening is an entrance through which a substrate W is carried in and out, and may be installed with a door (not illustrated). The door may seal the space of the housing 110 by blocking the opening when a substrate treating process is performed.

A first exhaust port 113, a second exhaust port 115, and a discharge line 117 may be formed at a lower end of the housing 110. The airflow formed in the housing 110 may be exhausted to the outside through the first exhaust port 113 and the second exhaust port 115.

As an example, airflow inside the bowl member 160 may be exhausted through the first exhaust port 113, and airflow outside the bowl member 160 may be exhausted through the second exhaust port 115. In addition, a treatment liquid and a rinse liquid may be discharged to the outside through the discharge line 117.

The first exhaust port 113 may be positioned on a circumferential surface of a cup of a first bowl 161 so that a gas is exhausted therethrough and a liquid does not pass therethrough, and may extend in an upward direction from a bottom surface of a second bowl 169. In addition, the discharge line 117 may be formed so as not to protrude from the bottom surface of the second bowl 169 so that the treatment liquid remains as little as possible on a bottom surface of the bowl member 160.

Although not illustrated in FIG. 1, an elevating unit may be provided in the housing 110. The elevating unit may adjust a relative height between the substrate support unit 130 and the bowl member 160. As an example, the elevating unit may be provided to be connected to the bowl member 160 or the substrate support unit 130 to elevate or lower the bowl member 160 or the substrate support unit 130. The elevating unit may include a bracket and a motor, but is not limited thereto.

The fan filter unit 120 may be installed at an upper end of the housing 110. The fan filter unit 120 may include a fan and a filter, and may form descending airflow in an internal space of the housing 110. That is, the fan filter unit 120 may form airflow in a downward direction above the substrate support unit 130.

Particles may be discharged to the outside via the first exhaust port 113 and the second exhaust port 115 through the descending airflow formed in the internal space of the housing 110. The fan filter unit 120 may be provided with a line communicating with the outside, and may supply outside air to the inside of the housing 110 through the line.

The substrate support unit 130 may support and rotate the substrate W. The substrate support unit 130 may be provided as a spin chuck, and may include a support plate 132 and an actuator 136. The support plate 132 may be provided as a circular plate having a smaller diameter than the substrate W. The actuator 136 may be provided as a motor, and may provide a torque to the support plate 132 so that the support plate 132 rotates.

The liquid supply unit 140 may supply the treatment liquid or the rinse liquid onto the substrate W. For example, the treatment liquid may be a photoresist, and the rinse liquid may be a thinner/solvent that dilutes the treatment liquid. The liquid supply unit 140 may include a first nozzle 141 and a second nozzle 145.

The first nozzle 141 may supply the treatment liquid at a central position of the substrate W. The first nozzle 141 may discharge the treatment liquid to the substrate W at a position facing a central portion of the substrate W. Although not illustrated in FIG. 1, the first nozzle 141 may be connected to a treatment liquid supply part (which may include a treatment liquid storage tank).

The second nozzle 145 may supply the rinse liquid at the central portion of the substrate W and/or at an edge position of the substrate W. That is, the second nozzle 145 may be provided to discharge the rinse liquid to the entire substrate W or discharge the rinse liquid to a bevel formed at an edge of the substrate W. Various modified examples such as an example in which the second nozzle 145 may receive the rinse liquid from a separate supply part or may be connected to the rinse liquid supply unit 150 to receive the rinse liquid are possible.

Times required for the first nozzle 141 and the second nozzle 145 to treat the substrate W may be different from each other. For example, after the substrate W is treated through the first nozzle 141, the substrate W may be treated through the second nozzle 145.

The rinse liquid supply unit 150 may supply the rinse liquid for cleaning the substrate W and the bowl member 160. The rinse liquid supply unit 150 may supply the rinse liquid to the second nozzle 145 in order to clean an upper surface of the substrate W. In addition, the rinse liquid supply unit 150 may include a first rinse liquid line 151 and a second rinse liquid line 152 in order to clean a lower surface of the substrate W and the bowl member 160. The first rinse liquid line 151 and the second rinse liquid line 152 may form a branched structure to receive the rinse liquid from one storage tank. However, the present disclosure is not limited thereto.

The first rinse liquid line 151 may have an outlet directed toward the lower surface of the substrate W. For example, when the substrate W is rotated by the substrate support unit 130, the treatment liquid may be supplied from the first nozzle 141 to the upper surface of the substrate W. In this case, the treatment liquid may enter the lower surface of the substrate W along the edge of the substrate W due to its viscosity. As such, an unnecessary liquid film may be formed on the lower surface of the substrate W, such that the lower surface of the substrate W needs to be cleaned. The cleaning of the lower surface of the substrate W may be performed by the rinse liquid discharged through the first rinse liquid line 151.

A nozzle (no reference numeral) may be provided at an end of the first rinse liquid line 151, and the rinse liquid may be supplied to the lower surface of the substrate W through the nozzle. In addition, since the nozzle may be provided so that an angle is changed in multiple directions, various modified examples such as an example in which a discharge port of the nozzle may be directed toward the bowl member 160 in addition to the lower surface of the substrate W are possible.

The second rinse liquid line 152 may have an outlet connected to the bowl member 160, installed to at least partially penetrate through the bowl member 160, or provided toward the bowl member 160. That is, the second rinse liquid line 152 may be provided in various structures for cleaning the bowl member 160. In addition, the second rinse liquid line 152 may be provided with a connector so as to be connected to the bowl member 160.

For example, when the treatment liquid is accumulated on the substrate W, the bowl member 160 should be replaced. In order to increase a replacement cycle of the bowl member 160, the second rinse liquid line 152 may supply the rinse liquid to the bowl member 160.

The bowl member 160 may be provided to surround the substrate support unit 130. The bowl member 160 may include a first bowl 161 and a second bowl 169.

The first bowl 161 may surround the substrate support unit 130 to prevent the substrate support unit 130 from being contaminated. At least a portion of the first bowl 161 may have a curvature. As an example, an upper portion of the first bowl 161 may have a ring shape.

In addition, the first bowl 161 may have a structure in which it is inclined downward in an outward direction to guide a flow of fluid such as the rinse liquid. For example, an inclined surface may be formed on the first bowl 161, and may be positioned above the first exhaust port 113 below the substrate W. The inclined surface of the first bowl 161 may be inclined downward in the outward direction so as to guide the fluid.

An edge of the inclined surface of the first bowl 161 may face the discharge line 117 or be provided outside the discharge line 117 to allow the treatment liquid to be easily introduced into the discharge line 117. In addition, the edge of the first bowl 161 may be spaced apart from the first exhaust port 113 while extending in the downward direction, to prevent the treatment liquid that has passed through the first bowl 161 from being introduced into the first exhaust port 113. In addition, a cup may be provided inside the inclined surface of the first bowl 161, and may be provided in a structure in which it surrounds a rotating shaft.

The first bowl 161 may have a structure in which it is easily cleaned with the rinse liquid, and an upper base 162 may be provided above the first bowl 161. This will be described later with reference to the drawings.

The second bowl 169 may be provided in a cylindrical structure in which it surrounds the first bowl 161 outside the first bowl 161. An upper portion of the second bowl 169 may have an inclined surface spaced apart from the first bowl 161 above the first bowl 161. An upper structure (inclined surface) of the second bowl 169 may be positioned higher than the substrate W. Airflow introduced along the substrate W may pass below the upper structure (inclined surface) of the second bowl 169. A lower portion of the second bowl 169 may be formed in a cup shape. That is, the lower portion of the second bowl 169 may be provided with a circumferential surface and a bottom surface. The first exhaust port 113 and the discharge line 117 may be installed on the bottom surface of the second bowl 169.

The second bowl 169 may be formed by separately providing the upper portion and the lower portion and then coupling the upper portion and the lower portion to each other. This is to easily install the first exhaust port 113 and the discharge line 117 in the second bowl 169, but the present disclosure is not limited thereto.

The guide part 171 may be provided on the inclined surface of the first bowl 161. The guide part 171 may have a spiral shape so as to guide a flow of the rinse liquid along a spiral. This will be described later with reference to the drawings.

The flow velocity adjusting unit 190 may change a velocity of the fluid including the rinse liquid inside the housing 110. As an example, the flow velocity adjusting unit 190 may be provided between the first bowl 161 and the second bowl 169. However, the present disclosure is not limited thereto. As another example, the flow velocity adjusting unit 190 may be provided at an end (upper end) of the discharge line 117. Alternatively, the flow velocity adjusting unit 190 may be provided on a moving path of the rinse liquid on the first bowl 161. In other words, the flow velocity adjusting unit 190 may be provided at various positions at which it may adjust the velocity of the fluid.

The flow velocity adjusting unit 190 may be provided as an ejector or a pump. For example, a suction device and/or a tube (e.g., a Venturi tube) of which a cross-sectional area of a flow passage is changed may be provided at an upper end of the ejector. In other words, various structures capable of forcibly sucking the fluid into the ejector or increasing a pressure of the fluid may be provided.

The rinse liquid may be rapidly moved by the flow velocity adjusting unit 190, and accordingly, a moving velocity of the rinse liquid is increased, such that a cleaning effect by a flow of the rinse liquid may be increased. That is, the flow velocity adjusting unit 190 may increase a cleaning power by increasing a flow velocity of the rinse liquid to increase a flow rate of the rinse liquid sweeping the first bowl 161 per hour.

In addition, although not illustrated in FIG. 1, a cover may be provided on an outer peripheral surface of the flow velocity adjusting unit 190 to prevent the flow velocity adjusting unit 190 from being contaminated by the treatment liquid. The cover may be replaced together with the bowl member 160 when the bowl member 160 is replaced, but is not limited thereto.

Hereinafter, the supply of the treatment liquid and the rinse liquid will be described with reference to the drawings.

FIGS. 2 and 3 are views illustrating flow states of fluids over time in the substrate treating apparatus according to some exemplary embodiments of the present disclosure.

It may be changed depending on process times whether or not fluids (treatment liquid and rinse liquid) supplied in the substrate treating process are supplied.

As an example, referring to FIG. 2, during a first process time (T1 to T2), a flow of the treatment liquid may be formed through the first nozzle 141, such that the treatment liquid may be supplied from the first nozzle 141 to the upper surface of the substrate W. After the treatment liquid such as the photoresist is applied onto the substrate W, a flow of the fluid through the first nozzle 141 may be blocked. That is, during a second process time (T2 to T3) after the first process time, the flow of the treatment liquid through the first nozzle 141 may be blocked.

Meanwhile, during the second process period (T2 to T3), a flow of fluid may be formed through the second nozzle 145, the first rinse liquid line 151, and the second rinse liquid line 152. In other words, the rinse liquid may be supplied so that the lower surface of the substrate W and the bowl member 160 are cleaned while the upper surface of the substrate W is cleaned.

For example, the rinse liquid may be supplied from the first rinse liquid line 151 to the lower surface of the substrate W so that the lower surface of the substrate W is cleaned while a flow of the rinse liquid is formed from the second nozzle 145 to the upper surface of the substrate W. At the same time, the rinse liquid may be supplied from the second rinse liquid line 152 to the bowl member 160 so that the bowl member 160 is cleaned.

Here, the rinse liquid is supplied to the lower surface of the substrate W after the photoresist is applied onto the substrate W in order to prevent the rinse liquid having a different temperature such as room temperature from being supplied to the lower surface of the substrate W on which heat is generated by a torque of the substrate support unit 130. That is, this is to minimize an influence of the photoresist treated at different thicknesses depending on a temperature to uniformly apply the treatment liquid onto the substrate W. Accordingly, the supply of the rinse liquid may have various modified examples as long as it does not influence on the substrate W.

As another example, referring to FIG. 3, when the treatment liquid is discharged from the first nozzle 141 to the substrate W during the first process time (T1 to T2) as in an example, a flow of fluid through the first rinse liquid line 151 may be blocked.

On the other hand, during the first process time (T1 to T2) during which the first nozzle 141 discharges the treatment liquid to the upper surface of the substrate W, a flow passage of the second rinse liquid line 152 is opened, such that the rinse liquid may be supplied to the bowl member 160.

That is, a flow of fluid passing through the first rinse liquid line 151 may not be performed simultaneously with a flow of fluid passing through the first nozzle 141. On the other hand, a flow of fluid passing through the second rinse liquid line 152 is not performed together with a flow of fluid through the first nozzle 141 and may be performed simultaneously with a flow of fluid through the second nozzle 145 according to an exemplary embodiment or may be performed simultaneously with a flow fluid through the second nozzle 145 while being performed simultaneously with a flow of fluid through the first nozzle 141 as another example.

Hereinafter, the bowl member 160, the guide part 171, and the like, will be described in detail with reference to the drawings.

FIG. 4 is an enlarged view of region A of FIG. 1, and FIGS. 5 and 6 are views for describing a bowl member of a substrate treating apparatus according to a first exemplary embodiment of the present disclosure.

Referring to FIGS. 4 to 6, the bowl member 160 may be provided with an upper base 162.

The upper base 162 may be disposed above the first bowl 161, may surround an upper portion of the first bowl 161, and may be formed in a ring shape so that the substrate support unit 130 is positioned at the center thereof. As an example, the upper base 162 may be fitted to the upper portion of the first bowl 161. However, the present disclosure is not limited thereto, and various modified examples such as an example in which the upper base 162 may be fixed to the first bowl 161 with an adhesive are possible.

The upper base 162 may have a rinse liquid supply flow passage 162U such as a first flow passage 162U1 and a second flow passage 162U2 formed therein.

The upper base 162 according to an example may have a gap formed between an upper surface of a step of the first bowl 161 (the uppermost end 161T of the first bowl 161) and the upper base 162 so that the rinse liquid is discharged in an outward direction of the first flow passage 162U1.

The first flow passage 162U1 is formed as a space between an upper surface of the first bowl 161 and a lower surface of the upper base 162, such that at least a portion of the first flow passage 162U1 may be formed in an arc shape along the upper surface of the first bowl 161. For example, the first flow passage 162U1 may be formed in a ring shape along an outer circumferential surface of the upper base 162. That is, the first flow passage 162U1 may be formed in a structure in which an edge circumference of the upper base 162 is concave in a ring shape.

A portion of an outer side of the first flow passage 162U1 may be surrounded by a region protruding from the upper surface of the first bowl 161. Alternatively, various modified examples such as an example in which a lower portion of the first flow passage 162U1 along with a portion of the outer side of the first flow passage 162U1 may be surrounded by the upper surface of the first bowl 161 are possible. Accordingly, the first flow passage 162U1 may be easily formed by the design of a mold without post-processing.

The second flow passage 162U2 may penetrate through a body (no reference numeral) (injection structure of the upper base 162) included in the upper base 162. As an example, the second flow passage 162U2 may penetrate from an inner peripheral surface (opposite to the first flow passage 162U1) or a lower surface of the body toward the first flow passage 162U1 and be connected to the first flow passage 162U1. The rinse liquid supply unit 150 may be connected to the second flow passage 162U2. As an example, a branch line (not illustrated) branched from the second rinse liquid line 152 may be connected to the second flow passage 162U2, and one or more second flow passages 162U2 may be provided. The rinse liquid may be discharged from the second flow passage 162U2 to the inclined surface of the first bowl 161 through the first flow passage 162U1.

In addition, the second flow passage 162U2, the first flow passage 162U1, and an outlet (gap between the lower surface of the upper base 162 and the uppermost end 161T of the first bowl 161) may have a structure in which heights thereof increase toward the outside so that a direction of a flow of the rinse liquid may be changed one or more times or a space may be expanded in at least some sections (which may be the first flow passage 162U1 in the present exemplary embodiment). As an example, heights may gradually increase in the order of the second flow passage 162U2, the first flow passage 162U1, and the outlet.

For example, an inlet through which the rinse liquid is introduced may be formed in the second flow passage 162U2, and an outlet through which the rinse liquid is discharged may be more adjacent to the first flow passage 162U1 than the second flow passage 162U2. In addition, the first flow passage 162U1 may have a greater height than the second flow passage 162U2 or may have a structure in which a perpendicular cut surface is bent one or more times with respect to the second flow passage 162U2.

The positions of the first flow passage 162U1 and the second flow passage 162U2 may be modified. Another example will be described with reference to FIG. 12.

In addition, the upper surface of the first bowl 161 protrudes at an edge thereof, such that the step may be formed. The gap may be formed between the lower surface of the upper base 162 and the upper surface of the step of the first bowl 161 (uppermost end 161T of the first bowl 161). Such a gap may form the outlet of the bowl member 160 through which the rinse liquid is discharged.

The guide part 171 may be provided on the inclined surface of the first bowl 161 so as to form a spiral surrounding the substrate support unit 130 (spin chuck), and guide a flow of the rinse liquid along the spiral. The guide part 171 may have a barrier shape in which it extends in a spiral direction from an upper portion of the inclined surface of the first bowl 161 to a lower portion thereof. As an example, the guide part 171 may be provided in a single belt shape.

In addition, the guide part 171 may cover the entirety of the inclined surface of the first bowl 161 so that the inclined surface of the first bowl 161 is not exposed in a front projection area. In other words, the guide part 171 may have a height that covers the entirety of the inclined surface of the first bowl 161 on a front projection drawing. Accordingly, the inclined surface of the first bowl 161 may be brought into contact with the rinse liquid filled in a flow passage formed by the guide part 171 to be cleaned in a state in which a dead zone is minimized.

The rinse liquid may be supplied in an amount enough to easily clean the first bowl 161. For example, the rinse liquid may be supplied to be filled up to or overflow an upper end of the guide part 171. The rinse liquid may clean the first bowl 161 while moving along the flow passage formed by the guide part 171. Here, a cleaning power of the rinse liquid may be improved according to a flow velocity of the rinse liquid. For example, the flow velocity of the rinse liquid is increased by the flow velocity adjusting unit 190, such that a flow rate of the rinse liquid sweeping the first bowl 161 per hour may be increased, and accordingly the cleaning power may be improved.

A lower end of the guide part 171 may have an open structure as illustrated in FIG. 6, but is not limited thereto.

Meanwhile, the guide part 171 is not limited to one belt. As an example, the guide part 171 may include two or more barriers 171A and 171B between an upper end and a lower end of the first bowl 161. That is, the guide part 171 may be provided along a spiral surrounding the substrate support unit 130 while a plurality of barriers 171A and 171B having a belt shape are in contact with and connected to each other or may be provided in a form in which a belt is segmented along a spiral surrounding the substrate support unit 130 while a plurality of barriers 171A and 171B are spaced apart from each other without being in contact with each other.

In addition, a lower portion of a barrier 171A on an upper end side of the first bowl 161 and an upper portion of a barrier 171B on a lower end side of the first bowl 161, of the barriers 171A and 171B neighboring to each other in a vertical direction, may be the same position (see FIG. 4). However, the present disclosure is not limited thereto, and the upper portion of the barrier 171B on the lower end side of the first bowl 161, of the barriers 171A and 171B provided to neighbor to each other in the vertical direction, may also be higher than the lower portion of the barrier 171A on the upper end side of the first bowl 161, of the barriers 171A and 171B provided to neighbor to each other in the vertical direction.

Accordingly, the inclined surface of the first bowl 161 is not limited to being cleaned only with the rinse liquid overflowing from the barrier 171A, and cleaning efficiency may be improved by the rinse liquid filled in the guide part 171 forming the flow passage. This is because the rinse liquid may clean the inclined surface of the first bowl 161 while sweeping the inclined surface of the first bowl 161 in a process in which the rinse liquid flows along the guide part 171 and the dead zone may be minimized or omitted. Here, the dead zone may refer to an inclined surface of the first bowl 161 that does not come into contact with the rinse liquid when the guide part 171 is filled with the rinse liquid, and may be an inclined surface of the first bowl 161 exposed on the front projection area between two barriers 171A and 171B in the vertical direction.

That is, when the upper portion of the barrier 171B of the barriers 171A and 171B neighboring to each other in the vertical direction is lower than the lower portion of the barrier 171A of the barriers 171A and 171B neighboring to each other in the vertical direction unlike the present exemplary embodiment, it may be difficult for the rinse liquid to sufficiently stay on an inclined surface between the upper portion of the barrier 171B and the lower portion of the barrier 171A.

On the other hand, in the present exemplary embodiment, the upper portion of the barrier 171B is equal to or higher than the lower portion of the barrier 171A, such that the rinse liquid may be filled between the upper portion of the barrier 171B and the lower portion of the barrier 171A. Therefore, a cleaning area of the inclined surface of the first bowl 161 surrounded by the barrier 171A may be increased, such that cleaning may be effectively performed.

In addition, the rinse liquid supplied to the flow passage of the guide part 171 is not limited to being supplied via the upper base 162, but may also be supplied through discharge holes 161H (see FIGS. 11 and 12). The discharge holes 161H is the same as or similar to those of second and third exemplary embodiments.

In addition, according to a modified example of an exemplary embodiment, the rinse liquid is not supplied through the upper base 162, and may be supplied through the discharge holes 161H. As an example, the discharge hole 161H may be positioned at a starting point of the guide part 171 and the rinse liquid may be filled along the spiral from the starting point of the guide part 171, and thus, an effect of supplying the rinse liquid along the entire circumference of the first bowl 161 may be obtained.

Hereinafter, modified examples of the present exemplary embodiment will be described with reference to FIGS. 7 to 12, and an overlapping description of the same components performing the same functions will be omitted.

First, FIGS. 7 and 8 are views for describing a bowl member of a substrate treating apparatus according to a second exemplary embodiment of the present disclosure. Contents different from those described with reference to FIGS. 1 to 6 will be mainly described with reference to FIGS. 7 and 8.

Referring to FIGS. 7 and 8, a bowl member 160 according to a second exemplary embodiment may include a guide part 171, like or similar to that of a first exemplary embodiment. However, the bowl member 160 according to a second exemplary embodiment may further include a pattern member 175 in which projections and/or grooves are repeatedly formed.

The pattern member 175 may include one or more guide grooves 175H, one or more projection members 175P, and/or one or more concave grooves 175D, and may guide a flow of the rinse liquid.

The guide grooves 175H may have an engraved structure of a straight line, a curved line, or a combination thereof in a spiral or oblique direction. The projection members 175P may have an embossed structure of a straight line, a curved line, or a combination thereof in a spiral or oblique direction.

A plurality of concave grooves 175D may be provided to be spaced apart from each other in a horizontal, straight, oblique, and/or spiral direction. The concave groove 175D may have a concave groove structure having a short axis and a long axis. For example, the concave groove 175D may have a rhombic shape or have an elliptical shape having a long axis in a horizontal or spiral direction. Alternatively, the concave groove 175D may have an egg shape having a long axis in a spiral direction and having a width decreasing from upstream toward downstream. Alternatively, the concave groove 175D may have a 'V' shape, a 'U' shape, or the like.

Although not illustrated in the drawings, various modifications such as an example in which convex parts having an embossed structure may be provided on the first bowl 161 in the same shape as an engraved shape of the concave grooves 175D are possible.

In addition, the guide grooves 175H, the projection members 175P, and the concave grooves 175D may be provided along an inner side surface/outer circumferential surface of the flow passage and/or the guide part 171, and may be disposed in combination with each other. As another example, each of the guide grooves 175H, the projection members 175P, and the concave grooves 175D may be provided between a plurality of discharge holes 161H, which will be described with reference to FIG. 12.

FIGS. 9 and 10 are views for describing a bowl member of a substrate treating apparatus according to a third exemplary embodiment of the present disclosure. Contents different from those described with reference to FIGS. 1 to 8 will be mainly described with reference to FIGS. 9 and 10.

Referring to FIGS. 9 and 10, the inclined surface of the first bowl 161 may have a stair structure. In other words, horizontal sections 161A parallel to the ground and vertical sections 161B perpendicular to the horizontal sections 161A may be repeatedly formed on the inclined surface of the first bowl 161.

In addition, in the present exemplary embodiment, a stair structure in which the horizontal sections 161A and the vertical sections 161B form layers in a radial direction has been described by way of example, but the present disclosure is not limited thereto. For example, a first exemplary embodiment and a third exemplary embodiment may be combined with each other, such that layers may be formed along the guide part 171. That is, the horizontal sections 161A and the vertical sections 161B may be formed along a spiral direction surrounding the substrate support unit 130 (spin chuck). In addition, various modified examples such as an example in which the guide part 171 according to a first exemplary embodiment may be formed along edges of the horizontal sections 161A and the vertical sections 161B are possible.

The rinse liquid may move in the downward direction along the vertical sections 161B by a continuously supplied rinse liquid while staying for a while in the horizontal sections 161A. The rinse liquid has an effect of staying in the horizontal sections 161A, such that cleaning efficiency of the first bowl 161 may be improved.

Guide grooves 175H, projection members 175P, and/or concave grooves 175D are formed in the first bowl 161, such that the rinse liquid may flow while being guided or spread. Referring to FIG. 9, it has been illustrated that the guide grooves 175H and the projection members 175P are partially provided on the inclined surface of the first bowl 161, but the present disclosure is not limited thereto.

FIGS. 11 and 12 are views for describing bowl members of substrate treating apparatuses according to a fourth exemplary embodiment and a fifth exemplary embodiment of the present disclosure. Contents different from those described with reference to FIGS. 1 to 10 will be mainly described with reference to FIGS. 11 and 12.

Referring to FIGS. 11 and 12, a liquid treating chamber 100 of a substrate treating apparatus 10 according to a fourth exemplary embodiment may include an upper base 162 like first to third exemplary embodiments. In addition, in a liquid treating chamber 100 of a substrate treating apparatus 10 according to a fifth exemplary embodiment, an upper base 162 may be omitted unlike first to third exemplary embodiments. That is, various modified examples such as an example in which the upper base 162 is provided and the rinse liquid is supplied through the upper base 162, the upper base 162 is omitted and the rinse liquid is supplied through discharge holes 161H, or the rinse liquid is simultaneously supplied from the upper base 162 and the discharge holes 161H according to a modified example of an exemplary embodiment are possible.

In other words, the discharge holes 161H may be formed in the first bowl 161 according to a modified example of an exemplary embodiment. The discharge holes 161H may communicate with the rinse liquid supply unit 150 and may discharge the rinse liquid. A plurality of discharge holes 161H may be provided to penetrate through the inclined surface of the first bowl 161. Pattern members 175 such as grooves and projections may be provided adjacent to the discharge holes 161H.

That is, one or more guide grooves 175H, one or more projection members 175P, and one or more concave grooves 175D may be provided adjacent to the discharge holes 161H. The pattern member 175 may be provided between the plurality of discharge holes 161H.

For example, a concave groove 175D, a guide groove 175H, and/or a projection member 175P may be provided between a pair of discharge holes 161H so that the rinse liquid spreads between the discharge holes 161H neighboring to each other. In this case, the guide groove 175H and the projection member 175P may have a length in substantially the same range as a distance between the pair of discharge holes 161H spaced apart from each other (e.g., the same length or a length difference within 20%).

In addition, the inclined surface of the first bowl 161 may have a first surface 161S1, a second surface 161S2, and a third surface 161S3. The second surface 161S2 may have an inclination direction different from that of the third surface 161S3. For example, the second surface 161S2 may form an inclined surface ascending toward a boundary surface with the third surface 161S3. In addition, the second surface 161S2 may have a curved surface or concave structure.

Alternatively, the second surface 161S2 may have a gentler inclination than the first surface 161S1. The third surface 161S3 may have a steeper inclination than the second surface 161S2. In addition, the third surface 161S3 may have the same inclination as or a steeper inclination than the first surface 161S1. In other words, the third surface 161S3 may have the greatest inclination angle, the first surface 161S1 may have the second greatest inclination angle, and the second surface 161S2 may have the smallest inclination angle.

Here, airflow moving along the first bowl 161 may sequentially pass through the first surface 161S1, the second surface 161S2, and the third surface 161S3. In particular, the airflow that has passed through the first surface 161S1 may become gentle or be changed while passing through the second surface 161S2 having a gentle or changed inclination.

Therefore, the airflow that has passed through the first surface 161S1 becomes gentle or is changed on the second surface 161S2, and then spreads on the third surface 161S3, such that the airflow colliding with an inner wall of the second bowl 169 may be weakened, and accordingly, vortex/backflow may be decreased.

In addition, the first bowl 161 may include a fourth surface 161S4 provided toward a lower portion of an edge of the third surface 161S3. The fourth surface 161S4 may be formed perpendicular to the ground.

In addition, guide grooves 175H, projection members 175P, and/or concave grooves 175D may be formed at the uppermost end 161T of the first bowl 161. Accordingly, when the rinse liquid is discharged through the rinse liquid supply flow passage 162U of the upper base 162, the rinse liquid may be discharged while being guided or spread by the guide grooves 175H, the projection members 175P, and/or the concave grooves 175D.

Meanwhile, according to a modification of an exemplary embodiment, the rinse liquid supply flow passage 162U may be formed in the first bowl 161. In addition, inner and outer positions of the first flow passage 162U1 and the second flow passage 162U2 of the rinse liquid supply flow passage 162U may be changed from those of a first exemplary embodiment. For example, the second flow passage 162U2 may be positioned outside the first flow passage 162U1. The second flow passages 162U2 may communicate with the discharge holes 161H and may be provided in the same number as the number of discharge holes 161H. In addition, various modified examples such as an example in which the first flow passage 162U1 may be provided without being exposed to the outside, a separate through hole may be formed in the first flow passage 162U1 toward the spin chuck, and the rinse liquid is supplied from the rinse liquid supply unit 150 connected to the through hole are possible.

FIG. 13 is a view illustrating bake chambers and a transfer chamber together in the substrate treating apparatus according to some exemplary embodiments of the present disclosure.

Referring to FIG. 13, a substrate treating apparatus 10 according to the present exemplary embodiment may include bake chambers 11, a transfer chamber 12, and buffer chambers 14 together with liquid treating chambers 100.

The transfer chamber 12 may be provided between the bake chambers 11 and the liquid treating chambers 100. The transfer chamber 12 may transfer substrates between the bake chambers 11, the liquid treating chambers 100, and the buffer chambers 14. As an example, the transfer chamber 12 may include a hand (no reference numeral) on which a substrate is put, and the hand may move along a guide rail (no reference numeral) to be able to move forward and rearward, and may have a structure in which it may move upward and downward and rotate.

The bake chambers 11 may heat the substrates on which liquid films have been treated in the liquid treating chambers 100, and may be provided in a row on one side of the transfer chamber 12. In addition, the bake chamber 11 may have a polyhedral structure (rectangular parallelepiped structure, etc.) in which a space is formed.

For example, the bake chamber 11 may include a cooling unit 11A and a heating unit 11B disposed therein so as to perform a heating process of heating a wafer and a cooling process of cooling the wafer. In addition, an entrance (not illustrated) is formed in a sidewall of the bake chamber 11, such that a substrate may enter or exit from the bake chamber 11.

The exemplary embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the exemplary embodiments described above are illustrative rather than being restrictive in all aspects.

What is claimed is:

1. A substrate treating apparatus comprising:
a spin chuck supporting a substrate;
a rinse liquid supply unit supplying a rinse liquid;

a first bowl including an inclined surface inclined downward in an outward direction of the spin chuck; and
a guide part provided on the inclined surface of the first bowl so as to form a spiral surrounding the spin chuck and guiding a flow of the rinse liquid along the spiral.

2. The substrate treating apparatus of claim 1, wherein the guide part is provided in a single belt shape.

3. The substrate treating apparatus of claim 1, wherein the guide part includes two or more barriers between an upper end and a lower end of the first bowl, and
an upper portion of a barrier on a lower end side of the first bowl, of the barriers neighboring to each other in a vertical direction, is the same position as or is higher than a lower portion of a barrier on an upper end side of the first bowl.

4. The substrate treating apparatus of claim 1, further comprising one or more guide grooves having an engraved structure of a straight line, a curved line, or a combination thereof.

5. The substrate treating apparatus of claim 1, further comprising one or more projection members having an embossed structure of a straight line, a curved line, or a combination thereof.

6. The substrate treating apparatus of claim 1, further comprising a concave groove having a concave groove structure having a short axis and a long axis.

7. The substrate treating apparatus of claim 6, wherein the concave groove has a rhombic shape, has an elliptical shape having a long axis in a horizontal or spiral direction, or has an egg shape having a long axis in the spiral direction and having a width decreasing from upstream toward downstream.

8. The substrate treating apparatus of claim 1, wherein the inclined surface of the first bowl has a stair structure in which horizontal sections parallel to a ground and vertical sections perpendicular to the horizontal sections are repeatedly formed.

9. The substrate treating apparatus of claim 1, wherein the first bowl has a first surface, a second surface, a third surface and a fourth surface sequentially formed from an upper portion thereof toward a lower portion thereof,
the second surface has an inclination angle different from those of the first surface and the third surface or has an inclination direction changed from those of the first surface and the third surface, and
the fourth surface forms a right angle with respect to a ground.

10. The substrate treating apparatus of claim 1, wherein at least a portion of an upper surface of the first bowl has a curvature,
the substrate treating apparatus further comprises an upper base disposed on the first bowl,
a space between the upper surface of the first bowl and a lower surface of the upper base forms a first flow passage and at least a portion of the first flow passage is formed in an arc shape along the upper surface of the first bowl,
the upper base includes a body and at least one second flow passage penetrating through the body and connected to the first flow passage, and
the rinse liquid sequentially passes through the second flow passage and the first flow passage and is discharged to the inclined surface of the first bowl.

11. The substrate treating apparatus of claim 4, wherein the first bowl includes one or more discharge holes formed to communicate with the rinse liquid supply unit, discharge the rinse liquid, and penetrate through the inclined surface.

12. The substrate treating apparatus of claim 11, wherein the guide grooves are provided adjacent to the discharge holes.

13. The substrate treating apparatus of claim 12, wherein the guide groove extends between a pair of discharge holes neighboring to each other among a plurality of discharge holes.

14. The substrate treating apparatus of claim 1, further comprising:
a second bowl provided outside the first bowl;
a housing in which the first bowl, the second bowl, and the spin chuck are provided; and
a flow velocity adjusting unit changing a velocity of a fluid including the rinse liquid inside the housing.

15. The substrate treating apparatus of claim 14, further comprising a discharge line provided on a bottom surface of the second bowl and discharging the fluid to the outside,
wherein the flow velocity adjusting unit is provided between the first bowl and the second bowl, is provided at an end of the discharge line, or is provided on the first bowl, and includes a pump or an ejector.

16. A substrate treating apparatus comprising:
a liquid treating chamber forming a liquid film on a substrate;
a bake chamber heating the substrate on which the liquid film has been treated in the liquid treating chamber; and
a transfer chamber provided between the liquid treating chamber and the bake chamber and transferring the substrate between the liquid treating chamber and the bake chamber,
wherein the liquid treating chamber includes:
a spin chuck supporting the substrate;
a rinse liquid supply unit supplying a rinse liquid;
a first bowl including an inclined surface inclined downward in an outward direction of the spin chuck; and
a guide part provided on the inclined surface of the first bowl so as to form a spiral surrounding the spin chuck and guiding a flow of the rinse liquid along the spiral.

17. A substrate treating apparatus comprising:
a spin chuck supporting a substrate;
a fan filter unit forming airflow in a downward direction above the spin chuck;
a first bowl including an inclined surface inclined downward in an outward direction of the spin chuck and including a plurality of discharge holes formed to discharge a rinse liquid;
an upper base disposed on the first bowl;
a second bowl provided outside the first bowl and provided with a discharge line through which the rinse liquid is discharged;
a rinse liquid supply unit supplying the rinse liquid to the substrate and the first bowl;
a guide part provided on the inclined surface of the first bowl so as to form a spiral surrounding the spin chuck and guiding a flow of the rinse liquid along the spiral;
a plurality of guide grooves having an engraved structure of a straight line, a curved line, or a combination thereof and extending between a pair of discharge holes neighboring to each other among the plurality of discharge holes;
a plurality of projection members having an embossed structure of a straight line, a curved line, or a combination thereof on the inclined surface; and
a concave groove having a concave groove structure on the inclined surface,
wherein at least a portion of an upper surface of the first bowl has a curvature, a space between the upper surface of the first bowl and a lower surface of the upper base forms a first flow passage and at least a portion of the first flow passage is formed in an arc shape along the upper surface of the first bowl, the upper base includes a body and at least one second flow passage penetrating through the body and connected to the first flow passage, and the rinse liquid sequentially passes through the second flow passage and the first flow passage and is discharged to the inclined surface of the first bowl.

\* \* \* \* \*